(12) United States Patent
Nishiura

(10) Patent No.: US 8,044,493 B2
(45) Date of Patent: Oct. 25, 2011

(54) GAAS SEMICONDUCTOR SUBSTRATE FOR GROUP III-V COMPOUND SEMICONDUCTOR DEVICE

(75) Inventor: Takayuki Nishiura, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 232 days.

(21) Appl. No.: 12/326,452

(22) Filed: Dec. 2, 2008

(65) Prior Publication Data

US 2009/0140390 A1 Jun. 4, 2009

(30) Foreign Application Priority Data

Dec. 4, 2007 (JP) ................................. 2007-313286

(51) Int. Cl.
*H01L 29/20* (2006.01)
*H01L 31/0304* (2006.01)

(52) U.S. Cl. ............ 257/615; 257/91; 257/628; 372/45; 372/46

(58) Field of Classification Search .................... 257/91, 257/615, 628; 372/45, 46
See application file for complete search history.

(56) References Cited

U.S. PATENT DOCUMENTS

| | | | | |
|---|---|---|---|---|
| 5,508,522 | A * | 4/1996 | Nakanishi et al. | 257/13 |
| 5,680,091 | A * | 10/1997 | Maeda et al. | 338/32 R |
| 6,518,602 | B1 * | 2/2003 | Yuasa et al. | 257/102 |
| 2001/0023022 | A1 | 9/2001 | Nishiura et al. | |
| 2002/0041148 | A1 * | 4/2002 | Cho et al. | 313/499 |
| 2004/0041162 | A1 * | 3/2004 | Shimoyama et al. | 257/91 |

FOREIGN PATENT DOCUMENTS

| | | |
|---|---|---|
| JP | 7-38194 | 2/1995 |
| JP | 9-278595 | 10/1997 |
| JP | 11-92297 | 4/1999 |
| JP | 2001-196333 | 7/2001 |
| JP | 2001-223191 | 8/2001 |
| JP | 2002-293686 | 10/2002 |

OTHER PUBLICATIONS

J.L. Zilko, et al., Auger Electron Spectroscopy Study of GaAs Substrate Cleaning Procedures, J. Electrochem. Soc., Feb. 1982, vol. 129, No. 2, pp. 406-408.

* cited by examiner

*Primary Examiner* — Phuc Dang
(74) *Attorney, Agent, or Firm* — Drinker Biddle & Reath LLP

(57) ABSTRACT

A GaAs semiconductor substrate includes a main surface ($10m$) having an inclined angle of 6° to 16° with respect to a (100) plane ($10a$), and a concentration of chlorine atoms on the main surface ($10m$) is not more than $1 \times 10^{13}$ cm$^{-2}$. Further, a method of manufacturing a GaAs semiconductor substrate includes a polishing step of polishing a GaAs semiconductor wafer, a first cleaning step of cleaning the polished GaAs semiconductor wafer, an inspection step of inspecting a thickness and a main surface flatness of the GaAs semiconductor wafer subjected to the first cleaning, and a second cleaning step of cleaning the inspected GaAs semiconductor wafer with one of an acid other than hydrochloric acid and an alkali. Thereby, a GaAs semiconductor substrate that allows to obtain a group III-V compound semiconductor device having high properties even when at least one group III-V compound semiconductor layer containing not less than three elements is grown on a main surface, and a method of manufacturing the same are provided.

2 Claims, 5 Drawing Sheets

GAAS SEMICONDUCTOR SUBSTRATE FOR GROUP III-V COMPOUND SEMICONDUCTOR DEVICE

BACKGROUND OF THE INVENTION

1. Field of the Invention

The present invention relates to a GaAs semiconductor substrate suitably used as a substrate for a group III-V compound semiconductor device and a method of manufacturing the same, and to a group III-V compound semiconductor device including the GaAs semiconductor substrate and a method of manufacturing the same.

2. Description of the Background Art

GaAs semiconductor substrates have been widely used as substrates for group III-V compound semiconductor devices such as an LED (light emitting diode), an LD (laser diode), and the like. A group III-V compound semiconductor device is obtained by forming one or more group III-V compound semiconductor layers on a main surface of a GaAs semiconductor substrate.

If an acid substance as an impurity is present in large amounts on a main surface of a GaAs semiconductor substrate, the main surface becomes rough. A shape defect occurs in a group III-V compound semiconductor layer formed on the rough main surface of the GaAs semiconductor substrate. Therefore, a yield of a group III-V compound semiconductor device is reduced.

Consequently, to increase a yield of a group III-V compound semiconductor device, for example, a group III-V compound semiconductor wafer in which the number of atoms of an acid substance on a polished and cleaned surface is not more than $5 \times 10^{12}$ per $cm^2$, and a method of manufacturing the same have been proposed (see Japanese Patent No. 3480411 (Japanese Patent Laying-Open No. 2001-223191)).

SUMMARY OF THE INVENTION

However, it has been found that when at least one group III-V compound semiconductor layer is grown on a main surface of a GaAs semiconductor substrate having a high concentration of chlorine atoms on the main surface to fabricate a group III-V compound semiconductor device, not only a reduction in a yield of the semiconductor device but also a deterioration in properties of the semiconductor device are caused. In particular, for a semiconductor device obtained when a group III-V compound semiconductor layer containing not less than three elements is grown, a greater deterioration in properties thereof has been found.

Accordingly, one object of the present invention is to propose a GaAs semiconductor substrate that allows to obtain a group III-V compound semiconductor device having high properties even when at least one group III-V compound semiconductor layer containing not less than three elements is grown on a main surface thereof, and a method of manufacturing the same.

The present invention is directed to a GaAs semiconductor substrate including a main surface having an inclined angle of 6° to 16° with respect to a (100) plane, wherein a concentration of chlorine atoms on the main surface is not more than $1 \times 10^{13}$ $cm^{-2}$. Preferably, the concentration of chlorine atoms on the main surface is not more than $3 \times 10^{12}$ $cm^{-2}$.

The present invention is also directed to a method of manufacturing the GaAs semiconductor substrate described above, including a polishing step of polishing a GaAs semiconductor wafer, a first cleaning step of cleaning the polished GaAs semiconductor wafer, an inspection step of inspecting a thickness and a main surface flatness of the GaAs semiconductor wafer subjected to the first cleaning, and a second cleaning step of cleaning the inspected GaAs semiconductor wafer with one of an acid other than hydrochloric acid and an alkali.

In the method of manufacturing a GaAs semiconductor substrate in accordance with the present invention, the first cleaning step can include a hydrochloric acid cleaning substep of cleaning the polished GaAs semiconductor wafer with hydrochloric acid.

Further, in the method of manufacturing a GaAs semiconductor substrate in accordance with the present invention, the first cleaning step, the inspection step, and the second cleaning step are performed in a clean chamber, and air is introduced from outside into the clean chamber through pure water mist, and the introduced air can be circulated through a filter containing activated charcoal. On this occasion, a concentration of chlorine atoms contained in the clean chamber after the second cleaning can be not more than 1500 $ng \cdot m^{-3}$, and can further be not more than 400 $ng \cdot m^{-3}$.

The present invention is further directed to a group III-V compound semiconductor device including the GaAs semiconductor substrate described above and at least one group III-V compound semiconductor layer containing not less than three elements formed on the main surface of the GaAs semiconductor substrate.

The present invention is still further directed to a method of manufacturing the group III-V compound semiconductor device described above, including the steps of preparing the GaAs semiconductor substrate, and growing the at least one group III-V compound semiconductor layer containing not less than three elements on the main surface of the GaAs semiconductor substrate.

According to the present invention, a GaAs semiconductor substrate that allows to obtain a group III-V compound semiconductor device having high properties even when at least one group III-V compound semiconductor layer containing not less than three elements is grown on a main surface thereof, and a method of manufacturing the same are provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
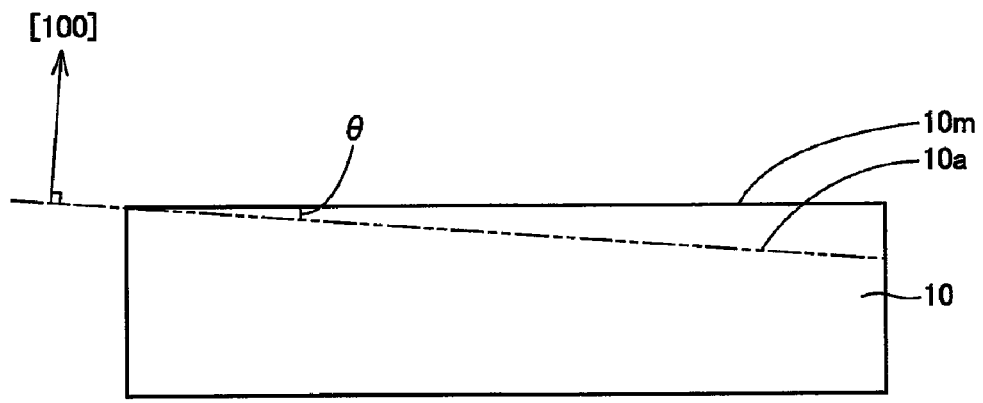
FIG. 1 is a schematic cross sectional view showing one embodiment of a GaAs semiconductor substrate in accordance with the present invention.

Referring to FIG. 1, in one embodiment of a GaAs semiconductor substrate in accordance with the present invention, a main surface 10m has an inclined angle θ of 6° to 16° with respect to a (100) plane 10a, and a concentration of chlorine atoms on main surface 10m is not more than $1\times10^{13}$ cm$^{-2}$. A group III-V compound semiconductor device having high properties can be obtained even when at least one group III-V compound semiconductor layer containing not less than three elements is grown on the main surface of such a GaAs semiconductor substrate.

Since main surface 10m of a GaAs semiconductor substrate 10 of the present embodiment has inclined angle θ of 6° to 16° with respect to (100) plane 10a, a group III-V compound semiconductor layer containing not less than three elements can be grown on the main surface easily and with good crystallinity. If inclined angle θ is less than 6° or greater than 16°, crystallinity of the semiconductor layer is reduced, and properties of a group III-V compound semiconductor device are deteriorated.

Further, since the concentration of chlorine atoms on main surface 10m of GaAs semiconductor substrate 10 of the present embodiment is not more than $1\times10^{13}$ cm$^{-2}$, a group III-V compound semiconductor device having high properties can be obtained even when one or more group III-V compound semiconductor layers containing not less than three elements are grown on main surface 10m.

Herein, a group III-V compound semiconductor layer containing not less than three elements refers to a group III-V compound semiconductor layer containing not less than three elements selected from group III elements and group V elements (i.e., a group III-V multi-element compound semiconductor layer). While the group III-V compound semiconductor layer is not particularly limited, examples thereof include an Al$_x$Ga$_{1-x}$As (0<x<1) semiconductor layer containing three elements of Al, Ga, and As, and an Al$_x$Ga$_y$In$_{1-x-y}$P (0<x, 0y, x+y<1) semiconductor layer containing four elements of Al, Ga, In, and P.

If the concentration of chlorine atoms on main surface 10m is higher than $1\times10^{13}$ cm$^{-2}$, chlorine atoms are more likely to be taken into a group III-V compound semiconductor layer containing not less than three elements, deteriorating properties of a group III-V compound semiconductor device. The concentration of chlorine atoms on main surface 10m of GaAs semiconductor substrate 10 can be measured by TXRF (Total Reflection X-ray Fluorescence). Further, in the present embodiment, it is preferable from a viewpoint of obtaining a group III-V compound semiconductor device having high properties that the concentration of chlorine atoms on main surface 10m is not more than $3\times10^{12}$ cm$^{-2}$.

Second Embodiment

Figure 2:
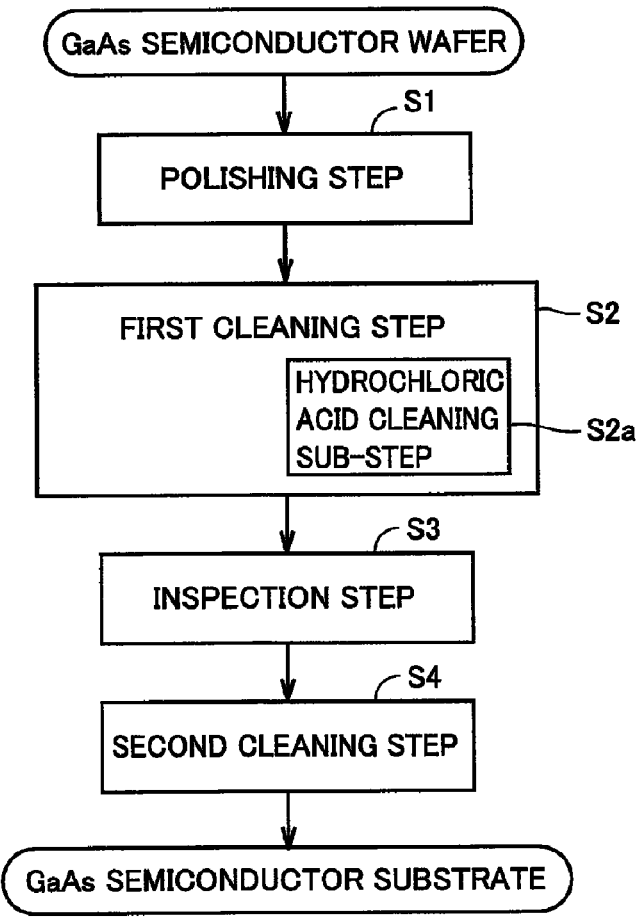
FIG. 2 is a flow chart illustrating one embodiment of a method of manufacturing a GaAs semiconductor substrate in accordance with the present invention.

Referring to FIG. 2, one embodiment of a method of manufacturing a GaAs semiconductor substrate in accordance with the present invention is directed to a method of manufacturing the GaAs semiconductor substrate of the first embodiment, including a polishing step S1 of polishing a GaAs semiconductor wafer, a first cleaning step S2 of cleaning the polished GaAs semiconductor wafer, an inspection step S3 of inspecting a thickness and a main surface flatness of the GaAs semiconductor wafer subjected to the first cleaning, and a second cleaning step S4 of cleaning the inspected GaAs semiconductor wafer with one of an acid other than hydrochloric acid and an alkali. With such a manufacturing method, the GaAs semiconductor substrate of the first embodiment can be manufactured.

Referring to FIG. 2, a GaAs semiconductor substrate of the present embodiment is specifically manufactured as described below. Firstly, a GaAs semiconductor wafer is prepared. The GaAs semiconductor wafer is obtained by slicing a GaAs semiconductor crystal ingot at planes parallel to each other and having an inclined angle of 6° to 16° with respect to a (100) plane, grinding an outer periphery thereof to have the outer configuration shaped, and removing a work-affected layer in a surface portion thereof by etching. The method of growing a GaAs semiconductor crystal ingot is not particularly limited, and a GaAs semiconductor crystal ingot can be grown by a variety of methods such as the HB (Horizontal Bridgeman) method, the LEC (Liquid Encapsulated Czochralski) method, the VB (Vertical Bridgeman) method, and the like.

Next, the GaAs semiconductor wafer obtained as described above is polished (polishing step S1). The polishing step may include one or more sub-steps. Preferably, three sub-steps of lapping, rough polishing, and fine polishing are included to improve the efficiency of polishing the wafer. In the lapping, cerium oxide abrasive grains or aluminum oxide abrasive grains having an average grain size of approximately 2 µm to 10 µm are preferably used. In the rough polishing, a mixture of colloidal silica and a chlorine-based abrasive agent is preferably used. In the fine polishing, a chlorine-based abrasive agent is preferably used.

Then, the polished GaAs semiconductor wafer is subjected to the first cleaning (first cleaning step S2). The first cleaning step may include one or more sub-cleaning steps. Preferably, a sub-step such as cleaning with an organic solvent, cleaning with one of an acid and an alkali, cleaning with pure water, or the like is included to improve the efficiency of cleaning the wafer. Further, cleaning with pure water is preferably performed as a final sub-step in the first cleaning step to remove a cleaning agent.

It is preferable from a viewpoint of improving the main surface flatness of the GaAs semiconductor wafer that the first cleaning step S2 includes a hydrochloric acid cleaning sub-step S2a of cleaning the GaAs semiconductor wafer with hydrochloric acid. However, since chlorine atoms with a concentration of approximately $5\times10^{13}$ cm$^{-2}$ remain on the main surface of the GaAs semiconductor wafer subjected to hydrochloric acid cleaning sub-step S2a, the GaAs semiconductor wafer subjected to the sub-step is preferably cleaned with one of an acid other than hydrochloric acid and an alkali.

Subsequently, the GaAs semiconductor wafer subjected to the first cleaning is dried. The drying step may include one or more sub-steps. Preferably, a sub-step such as alcohol vapor drying (for example, isopropyl alcohol vapor drying), spin drying, Marangoni drying, Rotagoni drying, or the like is included to improve the efficiency of drying the wafer.

Next, a thickness and a main surface flatness of the GaAs semiconductor wafer subjected to the first cleaning are inspected (inspection step S3). Herein, the main surface flatness refers to the accuracy of the shape of a plane over an entire wafer such as TTV (Total Thickness Variation), a warp, and the like of the wafer, and is measured with a Fizeau interferometer or the like. The thickness of a wafer has an effect on the mechanical strength of the wafer. Further, when a pattern is formed on a group III-V compound semiconductor layer formed on a main surface of a wafer to manufacture a group III-V compound semiconductor device, the main surface flatness of the wafer has an effect on the accuracy of the pattern. Therefore, the thickness and the main surface flatness of a semiconductor wafer are important inspection items having effects on properties of a group III-V compound semiconductor device.

Then, the inspected GaAs semiconductor wafer is cleaned with one of an acid other than hydrochloric acid and an alkali (second cleaning step S4). This step is performed because chlorine atoms may adhere to the main surface of the wafer also in inspection step S3 described above. Chlorine atoms existing on the main surface of the wafer react with Ga, In, As, P, or an alkari such as ammonia existing on the main surface to form a chloride. The chloride is easily removed by the cleaning with one of an acid other than hydrochloric acid and an alkali. The GaAs semiconductor wafer cleaned with one of an acid other than hydrochloric acid and an alkali is thereafter cleaned with pure water, and then dried. On this occasion, a drying method identical to that used in the drying after the first cleaning is performed.

Subsequently, the GaAs semiconductor wafer subjected to the second cleaning (hereinafter referred to as a GaAs semiconductor substrate) is subjected to a minimum surface inspection, and then put into a container formed of a material such as PP (polypropylene), PC (polycarbonate), PBT (polybutyl terephthalate), or the like. The container is put into a bag formed of a material such as PE (polyethylene) laminated with aluminum foil having high oxygen barrier property, and a vacuum of not more than 665 Pa (5 Torr) is created in the bag. Thereafter, nitrogen gas is introduced into the bag, and the bag is sealed. Thereby, the wafer is sealed in a nitrogen gas atmosphere.

Alternatively, the container containing the GaAs semiconductor substrate subjected to the surface inspection described above is put into a first resin bag having an oxygen permeability of not less than 0.5 ml·m$^{-2}$·day$^{-1}$·atm$^{-1}$, and the first resin bag is sealed (first seal). Subsequently, the first resin bag subjected to the first seal is put into a second resin bag having an oxygen permeability of less than 0.5 ml·m$^{-2}$·day$^{-1}$·atm$^{-1}$ together with a deoxidizer, and the second resin bag is sealed (second seal). On this occasion, moisture inside the container can also be reduced by using a deoxidizer having dehydrating action (for example, iron powder, titanium dioxide powder, or the like).

Figure 3:
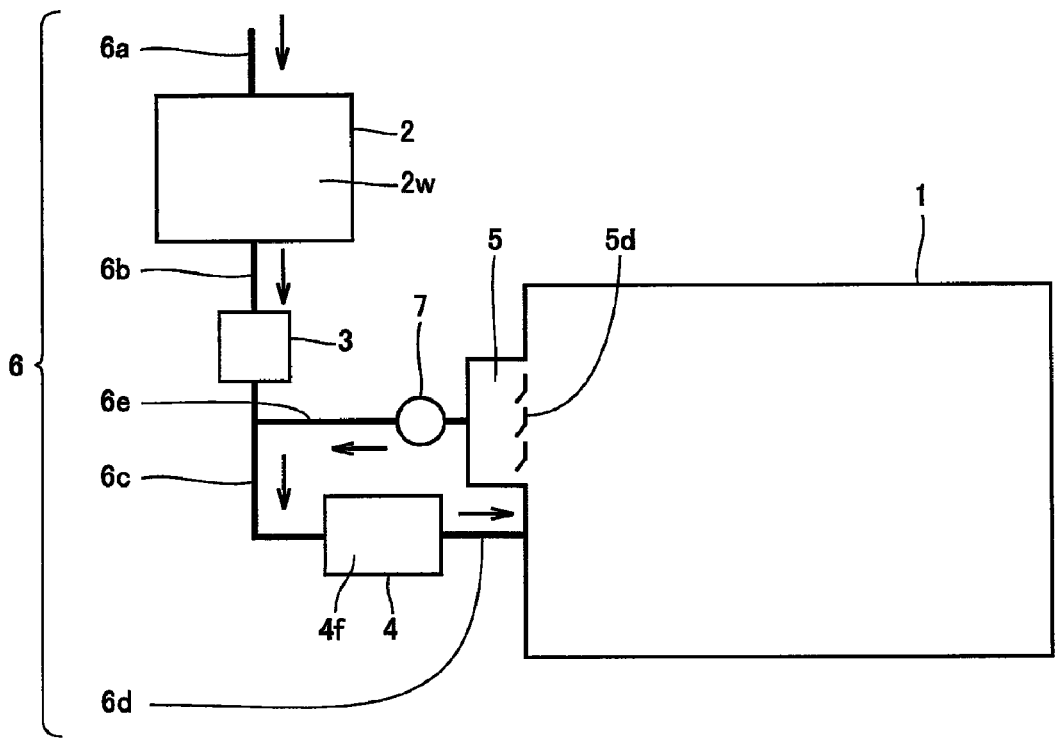
FIG. 3 is a schematic view showing one embodiment of a clean chamber used in the method of manufacturing a GaAs semiconductor substrate in accordance with the present invention.

Now referring to FIG. 3, in the method of manufacturing the GaAs semiconductor substrate of the present embodiment, it is preferable that the first cleaning step, the inspection step, and the second cleaning step are performed in a clean chamber 1, and that air is introduced from outside into clean chamber 1 through pure water mist 2w, and the introduced air is circulated through a filter 4f containing activated charcoal. A concentration of chlorine atoms contained in clean chamber 1 can be reduced efficiently and maintained low by allowing outside air to pass through pure water mist 2w when it is introduced into clean chamber 1, in addition to allowing the air inside clean chamber 1 to pass through filter 4f during the circulation. A concentration of chlorine atoms on the main surface of the GaAs semiconductor substrate after the second cleaning step can be maintained low by performing the first cleaning step, the inspection step, and the second cleaning step on the GaAs semiconductor wafer in the clean chamber.

Referring to FIG. 3, the introduction of air from outside into clean chamber 1 is performed for example as described below. Herein, arrows in FIG. 3 indicate a flow of air in an air line 6. Firstly, outside air is introduced into a pure water scrubber chamber 2 through an air line 6a. Pure water mist 2w is formed in pure water scrubber chamber 2, and the air passes through pure water mist 2w. As a result, a concentration of chlorine atoms contained in the air is reduced. The air that has passed through pure water mist 2w is introduced into a dehumidifying chamber 3 through an air line 6b, and humidity in the air is reduced. The air that has passed through dehumidifying chamber 3 is introduced into a filter chamber 4 through an air line 6c. Filter 4f containing activated charcoal is disposed in filter chamber 4, and the air passes through filter 4f containing activated charcoal. As a result, the concentration of chlorine atoms contained in the air is further reduced. Consequently, the air that has passed through filter 4f containing activated charcoal and contains chlorine atoms with an extremely reduced concentration is introduced into clean chamber 1 through an air line 6d.

The circulation of the air inside the clean chamber is performed as described below, for example by an air circulation apparatus 7 disposed on an air line 6e. The air inside clean chamber 1 flows via a negative pressure buffer chamber 5 into filter chamber 4 through air lines 6e and 6c. The air passes through filter 4f containing activated charcoal in filter chamber 4, and thereby chlorine atoms entering into clean chamber 1 through a minute gap in clean chamber 1, chlorine atoms generated within the chamber, and the like are efficiently removed. As a result, the concentration of chlorine atoms contained in the air is further reduced and maintained low. The air containing chlorine atoms with a concentration that is further reduced and maintained low returns to clean chamber 1 through air line 6d. As air circulation apparatus 7, a circulation fan, a circulation pump, or the like is used.

In this manner, clean chamber 1 in which the concentration of chlorine atoms is reduced and maintained can be obtained, and the GaAs semiconductor substrate with a reduced concentration of chlorine atoms on the main surface can be obtained by performing the first cleaning step, the detection step, and the second cleaning step on the GaAs semiconductor wafer in such clean chamber 1. On this occasion, it is preferable from a viewpoint of obtaining a GaAs semiconductor substrate in which a concentration of chlorine atoms on a main surface is not more than $1 \times 10^{13}$ cm$^{-2}$ that a concentration of chlorine atoms contained in the clean chamber after the second cleaning is not more than 1500 ng·m$^{-3}$. Further, it is more preferable from a viewpoint of obtaining a GaAs semiconductor substrate in which a concentration of chlorine atoms on a main surface is not more than $3 \times 10^{13}$ cm$^{-2}$ that a concentration of chlorine atoms contained in the clean chamber after the second cleaning is not more than 400 ng·m$^{-3}$.

Third Embodiment

Figure 4:
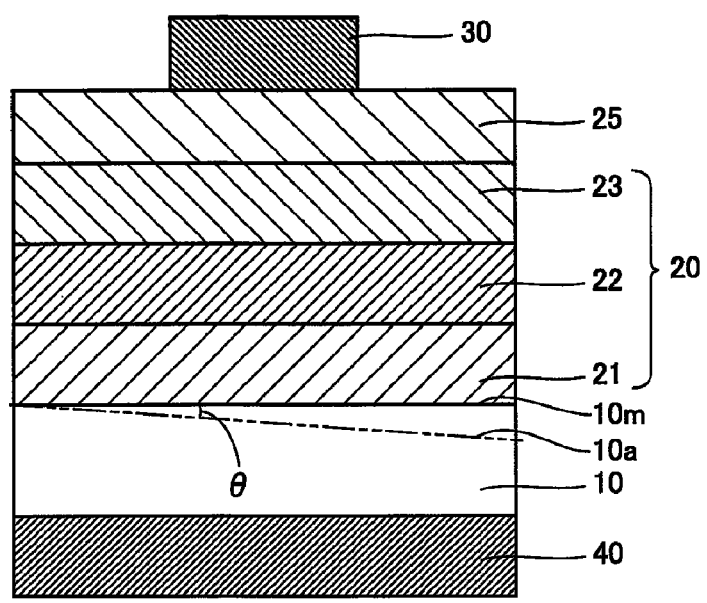
FIG. 4 is a schematic cross sectional view showing one embodiment of a group III-V compound semiconductor device in accordance with the present invention.

Referring to FIG. 4, according to one embodiment of the present invention, a group III-V compound semiconductor device includes GaAs semiconductor substrate 10 in which main surface 10m has inclined angle θ of 6° to 16° with respect to (100) plane 10a and a concentration of chlorine atoms on main surface 10m is not more than $1 \times 10^{13}$ cm$^{-2}$, and at least one group III-V compound semiconductor layer 20 containing not less than three elements formed on main surface 10m of GaAs semiconductor substrate 10. Since the concentration of chlorine atoms on the main surface of the GaAs semiconductor substrate is not more than $1 \times 10^{13}$ cm$^{-2}$ in such a semiconductor device, less chlorine atoms are taken into the group III-V compound semiconductor layer, improving properties of the semiconductor device.

Referring to FIG. 4, the group III-V compound semiconductor device of the present embodiment is, for example, an LED including: an n-type GaAs semiconductor substrate serving as GaAs semiconductor substrate 10; and an n-type $Al_{x1}Ga_{y1}In_{1-x1-y1}P$ ($0<x1$, $0<y1$, $x1+y1<1$) semiconductor layer 21, a light emitting layer 22 with a multiple quantum well structure formed of five pairs of well layers ($Ga_{y3}In_{1-y3}P$ ($0<y3<1$) layers) and barrier layers ($Al_{x4}Ga_{y4}In_{1-x4-y4}P$ ($0<x4$, $0<y4$, $x4+y4<1$) layers), and a p-type $Al_{x2}Ga_{y2}In_{1-x2-y2}P$ ($0<x2$, $0<y2$, $x2+y2<1$) semiconductor layer 23 serving as least one group III-V compound semiconductor layer 20 containing not less than three elements formed on main surface 10m of GaAs semiconductor substrate 10.

The LED of the present embodiment further includes a p-type GaAs contact layer 25 formed on p-type $Al_{x2}Ga_{y2}In_{1-x2-y2}P$ ($0<x2$, $0<y2$, $x2+y2<1$) semiconductor layer 23 serving as the uppermost layer of group III-V compound semiconductor layer 20 containing not less than three elements, an Au—Zn electrode as a p-side electrode 30 formed on p-type GaAs contact layer 25, and an Au—Ge electrode as an n-side electrode 40 formed on a main surface of the n-type GaAs semiconductor substrate (GaAs semiconductor substrate 10) on which group III-V compound semiconductor layer 20 is not formed.

Since the concentration of chlorine atoms on main surface 10m of GaAs semiconductor substrate 10 is not more than $1\times10^{13}$ cm$^{-2}$ in the LED of the present embodiment, less chlorine atoms are taken into group III-V compound semiconductor layer 20, and thus light emission from light emitting layer 22 is not disturbed. Consequently, high light emission intensity can be obtained.

Fourth Embodiment

Referring to FIG. 4, one embodiment of a method of manufacturing a group III-V compound semiconductor device in accordance with the present invention is directed to a method of manufacturing the group III-V compound semiconductor device of the third embodiment, including the steps of preparing GaAs semiconductor substrate 10, and growing at least one group III-V compound semiconductor layer 20 containing not less than three elements on main surface 10m of GaAs semiconductor substrate 10. With such a manufacturing method, a group III-V compound semiconductor device having high properties can easily be obtained.

In the step of preparing GaAs semiconductor substrate 10, for example, the GaAs semiconductor substrate obtained by the manufacturing method of the second embodiment can be prepared.

Further, referring to FIG. 4, in the step of growing at least one group III-V compound semiconductor layer 20 containing not less than three elements on main surface 10m of GaAs semiconductor substrate 10, for example, n-type $Al_{x1}Ga_{y1}In_{1-x1-y1}P$ ($0<x1$, $0<y1$, $x1+y1<1$) semiconductor layer 21, light emitting layer 22 with a multiple quantum well structure formed of five pairs of well layers ($Ga_{y3}In_{1-y3}P$ ($0<y3<1$) layers) and barrier layers ($Al_{x4}Ga_{y4}In_{1-x4-y4}P$ ($0<x4$, $0<y4$, $x4+y4<1$) layers), and p-type $Al_{x2}Ga_{y2}In_{1-x2-y2}P$ ($0<x2$, $0<y2$, $x2+y2<1$) semiconductor layer 23 are sequentially grown as at least one group III-V compound semiconductor layer 20 containing not less than three elements, on a main surface of an n-type GaAs semiconductor substrate serving as GaAs semiconductor substrate 10, by the MOVPE (Metal Organic Vapor Phase Epitaxy) method.

Next, p-type GaAs contact layer 25 is grown on p-type $Al_{x2}Ga_{y2}In_{1-x2-y2}P$ ($0<x2$, $0<y2$, $x2+y2<1$) semiconductor layer 23 serving as the uppermost layer of group III-V compound semiconductor layer 20 by the MOVPE (Metal Organic Vapor Phase Epitaxy) method.

Then, the Au—Zn electrode as p-side electrode 30 is formed on p-type GaAs contact layer 25 by vacuum deposition, and the Au—Ge electrode as n-side electrode 40 is formed on a main surface of the n-type GaAs semiconductor substrate (GaAs semiconductor substrate 10) on which group III-V compound semiconductor layer 20 is not formed, by vacuum deposition.

Example 1

1. Preparation of GaAs Semiconductor Wafer

A GaAs semiconductor ingot grown by the vertical boat (vertical Bridgeman) method was sliced with a wire saw to be parallel to a plane inclined from a (100) plane by 15° in a [011] direction to obtain a GaAs semiconductor wafer. A main surface of the GaAs semiconductor wafer was a plane at an angle of not more than 0.1° with respect to the plane inclined from the (100) plane by 15° in the [011] direction. An outer peripheral portion of the GaAs semiconductor wafer was ground with a diamond grindstone to have the outer configuration shaped. To remove a work-affected layer in the GaAs semiconductor wafer having the outer configuration shaped, the main surface thereof was etched with an aqueous solution containing ammonia and hydrogen peroxide (concentration of ammonia: 4% by mass, concentration of hydrogen peroxide: 4% by mass).

2. Polishing Step (S1)

A main surface (main rear surface) of the GaAs semiconductor wafer opposite to the main surface to be polished was waxed and bonded to a heated ceramic plate. After the ceramic plate was cooled, lapping, rough polishing, and fine polishing were performed on the main surface of the GaAs semiconductor wafer according to a procedure described below. Firstly, lapping was performed using SiC abrasive grains or aluminum oxide abrasive grains having an average grain size of 6 μm. Next, rough polishing was performed using a mixture of colloidal silica having an average grain size of 0.03 μm and a chlorine-based abrasive agent (INSEC NIB manufactured by Fujimi Incorporated). Then, fine polishing was performed using a chlorine-based abrasive agent (INSEC NIB manufactured by Fujimi Incorporated).

3. First Cleaning Step (S2)

After the polishing described above, the GaAs semiconductor wafer was cleaned with ultrapure water (meaning pure water purified to have a specific resistance of not less than 10 MΩ·cm in the present application: hereinafter the same applies), and the wafer was separated from the ceramic plate. Next, the GaAs semiconductor wafer subjected to the polishing described above was moved into a clean chamber, and subjected to cleaning with an organic solvent, cleaning with one of an acid and an alkali, and cleaning with pure water described below in the clean chamber. Firstly, cleaning with an organic solvent was performed to clean the wax on the main rear surface of the wafer with isopropyl alcohol. Next, cleaning with one of 1% by mass of hydrochloric acid and 0.5% by mass of TMAH (tetramethylammonium hydroxide) was performed. Then, cleaning with pure water was performed using ultrapure water. Subsequently, alcohol vapor drying was performed on the GaAs semiconductor wafer subjected to the first cleaning in the clean chamber, using isopropyl alcohol.

4. Inspection Step (S3)

Next, a thickness and a main surface flatness of the dried GaAs semiconductor wafer were inspected in the clean chamber. While the inspection method is not particularly limited, the thickness of the wafer was inspected with a non-contact thickness meter or the like, and the main surface flatness was inspected with a Fizeau interferometer or the like.

5. Second Cleaning Step (S4)

Next, cleaning with one of an acid other than hydrochloric acid and an alkali, and cleaning with pure water were performed on the inspected GaAs semiconductor wafer in the clean chamber according to a procedure described below. Firstly, cleaning with one of 1% by mass of nitric acid and 0.5% by mass of ammonia was performed. Then, cleaning with pure water was performed using ultrapure water. Subsequently, alcohol vapor drying was performed on the GaAs semiconductor wafer subjected to the second cleaning, using isopropyl alcohol.

Referring to FIG. 3, air was introduced from outside, through pure water mist 2w, into clean chamber 1 in which the first cleaning step, the inspection step, and the second cleaning step described above are to be performed, and the introduced air was circulated through filter 4f containing activated charcoal. Therefore, a concentration of chlorine atoms contained in the clean chamber was maintained low, and the concentration of chlorine atoms contained in the clean chamber after the second cleaning described above was 120 ng·m$^{-3}$.

A surface inspection was performed on the GaAs semiconductor wafer subjected to the above steps (that is, a GaAs semiconductor substrate), and the GaAs semiconductor substrate was left in the clean chamber for two hours. The concentration of chlorine atoms on the main surface of the GaAs semiconductor substrate on this occasion was 167×10$^{10}$ cm$^{-2}$ when measured by TXRF. Table 1 shows the result.

6. Growth of $Al_xGa_yIn_{1-x-y}P$ (0<x, 0<y, x+y<1) Epitaxial Layer

Figure 5:
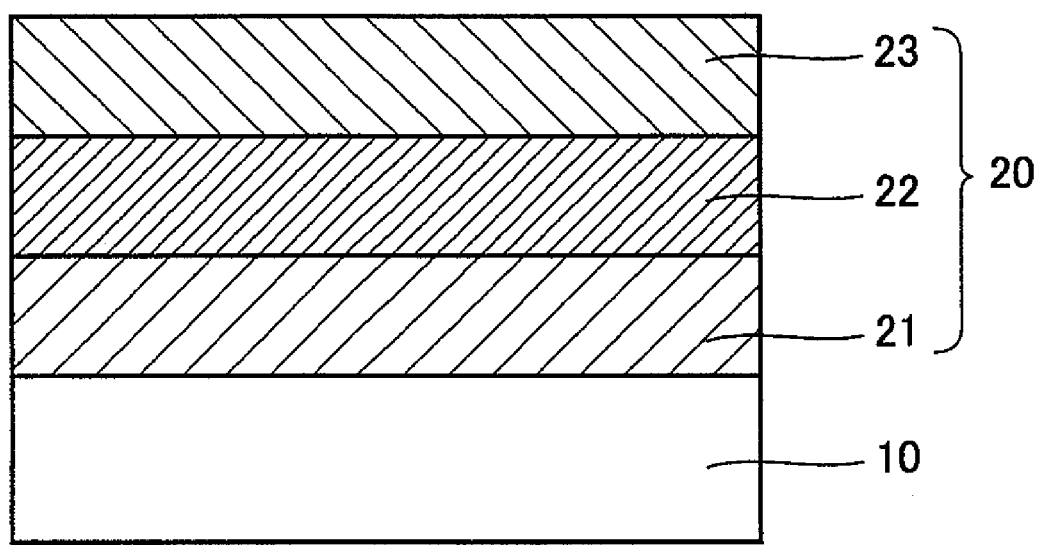
FIG. 5 is a schematic cross sectional view showing an exemplary structure of an epitaxial layer.

Next, referring to FIG. 5, 1 µm-thick n-type $Al_{x1}Ga_{y1}In_{1-x1-y1}P$ (x1=0.25, y1=0.25) semiconductor layer 21, light emitting layer 22 with a multiple quantum well structure formed of five pairs of 10 nm-thick well layers ($Ga_{y3}In_{1-y3}P$ (y3=0.5) semiconductor layers) and 10 nm-thick barrier layers ($Al_{x4}Ga_{y4}In_{1-x4-y4}P$ (x4=0.25, y4=0.25) semiconductor layers), and p-type $Al_{x2}Ga_{y2}In_{1-x2-y2}P$ (x2=0.25, y2=0.25) semiconductor layer 23 were sequentially epitaxially grown as at least one group III-V compound semiconductor layer 20 containing not less than three elements, on main surface 10m of GaAs semiconductor substrate 10, by the MOVPE (Metal Organic Vapor Phase Epitaxy) method. A plurality of epitaxially grown layers obtained as described above is called an AlGaInP epitaxial layer.

A PL (photoluminescence) intensity of the AlGaInP epitaxial layer obtained as described above was measured as described below. Ar laser light as excitation light was applied to the AlGaInP epitaxial layer, spectrometry was performed on light having a wavelength in a range of not less than 600 nm and not more than 700 nm as PL light emitted from the AlGaInP epitaxial layer, and the light subjected to spectrometry was detected by a photomultiplier to calculate the PL intensity. The PL intensity of the AlGaInP epitaxial layer in the present example was 70 AU (arbitrary unit). Table 1 shows the result.

Example 2

The polishing step, the first cleaning step, the inspection step, and the second cleaning step were performed on a GaAs semiconductor wafer in a manner identical to that of example 1 except that a concentration X of chlorine atoms contained in the clean chamber after the second cleaning was 750 ng·m$^{-3}$, and a GaAs semiconductor substrate was obtained. A concentration Y of chlorine atoms on a main surface of the GaAs semiconductor substrate obtained in the present example was 668×10$^{10}$ cm$^{-2}$. Next, an AlGaInP epitaxial layer was formed on the main surface of the GaAs semiconductor substrate in a manner identical to that of example 1. A PL intensity Z of the AlGaInP epitaxial layer in the present example was 64 AU. Table 1 shows the result.

Comparative Example 1

The polishing step, the first cleaning step, the inspection step, and the second cleaning step were performed on a GaAs semiconductor wafer in a manner identical to that of example 1 except that the first cleaning step, the inspection step, and the second cleaning step were not performed in the clean chamber described above and that concentration X of chlorine atoms contained in an atmosphere around a substrate after the second cleaning was 1514 ng·m$^{-3}$, and a GaAs semiconductor substrate was obtained. Concentration Y of chlorine atoms on a main surface of the GaAs semiconductor substrate obtained in the present comparative example was 1320×10$^{10}$ cm$^{-2}$. Next, an AlGaInP epitaxial layer was formed on the main surface of the GaAs semiconductor substrate in a manner identical to that of example 1. PL intensity Z of the AlGaInP epitaxial layer in the present comparative example was 60 AU. Table 1 shows the result.

Comparative Example 2

The polishing step, the first cleaning step, the inspection step, and the second cleaning step were performed on a GaAs semiconductor wafer in a manner identical to that of comparative example 1 except that concentration X of chlorine atoms contained in an atmosphere around a substrate after the second cleaning was 5387 ng·m$^{-3}$, and a GaAs semiconductor substrate was obtained. Concentration Y of chlorine atoms on a main surface of the GaAs semiconductor substrate obtained in the present comparative example was 2299×10$^{10}$ cm$^{-2}$. Next, an AlGaInP epitaxial layer was formed on the main surface of the GaAs semiconductor substrate in a manner identical to that of example 1. PL intensity Z of the AlGaInP epitaxial layer in the present comparative example was 53 AU.

Comparative Example 3

The polishing step, the first cleaning step, the inspection step, and the second cleaning step were performed on a GaAs semiconductor wafer in a manner identical to that of comparative example 1 except that concentration X of chlorine atoms contained in an atmosphere around a substrate after the second cleaning was 2471 ng·m$^{-3}$, and a GaAs semiconductor substrate was obtained. Concentration Y of chlorine atoms on a main surface of the GaAs semiconductor substrate obtained in the present comparative example was 2413×10$^{10}$ cm$^{-2}$. Next, an AlGaInP epitaxial layer was formed on the main surface of the GaAs semiconductor substrate in a manner identical to that of example 1. PL intensity Z of the AlGaInP epitaxial layer in the present comparative example was 51 AU.

Comparative Example 4

The polishing step, the first cleaning step, the inspection step, and the second cleaning step were performed on a GaAs semiconductor wafer in a manner identical to that of comparative example 1 except that concentration X of chlorine atoms contained in an atmosphere around a substrate after the second cleaning was 5700 ng·m$^{-3}$, and a GaAs semiconductor substrate was obtained. Concentration Y of chlorine atoms on a main surface of the GaAs semiconductor substrate obtained in the present comparative example was 4421×10$^{10}$ cm$^{-2}$. Next, an AlGaInP epitaxial layer was formed on the main surface of the GaAs semiconductor substrate in a manner identical to that of example 1. PL intensity Z of the AlGaInP epitaxial layer in the present comparative example was 38 AU.

Comparative Example 5

The polishing step, the first cleaning step, the inspection step, and the second cleaning step were performed on a GaAs semiconductor wafer in a manner identical to that of comparative example 1 except that concentration X of chlorine atoms contained in an atmosphere around a substrate after the second cleaning was 6800 ng·m$^{-3}$, and a GaAs semiconductor substrate was obtained. Concentration Y of chlorine atoms on a main surface of the GaAs semiconductor substrate obtained in the present comparative example was 4895×10$^{10}$ cm$^{-2}$. Next, an AlGaInP epitaxial layer was formed on the main surface of the GaAs semiconductor substrate in a manner identical to that of example 1. PL intensity Z of the AlGaInP epitaxial layer in the present comparative example was 32 AU. Table 1 shows the result.

It is found from equation (1) that a GaAs semiconductor substrate in which concentration Y of chlorine atoms on a main surface thereof is not more than 1×10$^{13}$ cm$^{-2}$ can be obtained when concentration X of chlorine atoms contained in the clean chamber after the second cleaning is not more than 1500 ng·m$^{-3}$, and a GaAs semiconductor substrate in which concentration Y of chlorine atoms on a main surface thereof is not more than 3×10$^{12}$ cm$^{-2}$ cm can be obtained when concentration X of chlorine atoms contained in the clean chamber after the second cleaning is not more than 400 ng·m$^{-3}$.

Further, the relationship between concentrations Y of chlorine atoms on the main surfaces of the substrates (unit: ×10$^{10}$ cm$^{-2}$) and PL intensities Z of the AlGaInP epitaxial layers formed on the main surfaces of the substrates (unit: AU (arbitrary unit)) in examples 1 and 2 and comparative examples 1 to 5 is plotted as points A to G, respectively, in a graph of FIG. 7.

Figure 7:
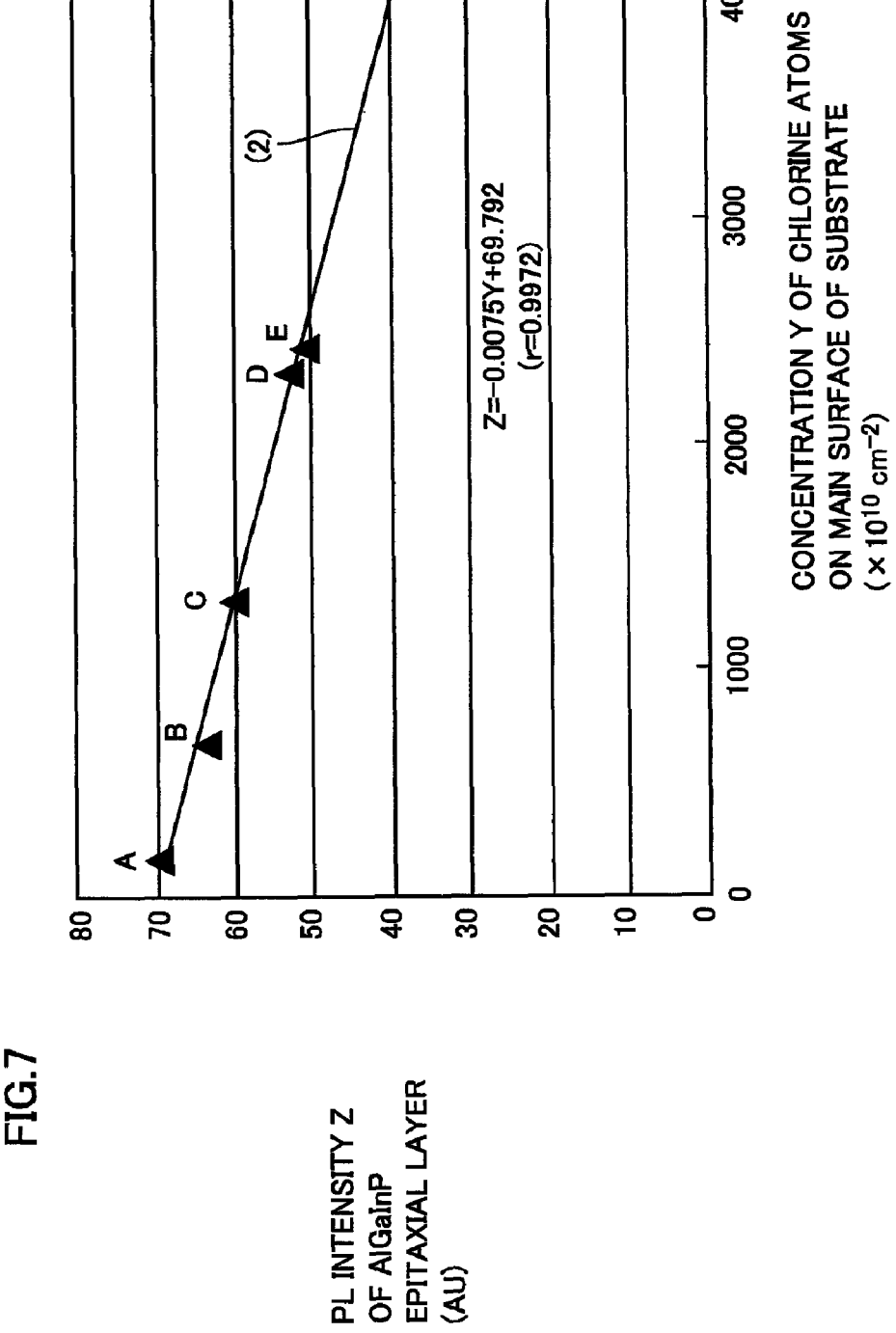
FIG. 7 is a graph showing the relationship between a concentration of chlorine atoms on a main surface of a substrate and a PL intensity of an AlGaInP epitaxial layer formed on the main surface of the substrate.

As can be seen from FIG. 7, it is recognized that there is a correlation between concentration Y of chlorine atoms on the main surface of the substrate (unit: ×10$^{10}$ cm$^{-2}$) and PL intensity Z of the AlGaInP epitaxial layer formed on the main surface of the substrate (unit: AU), represented by the following equation (2):

$$Z = -0.0075 Y + 69.792 \tag{2}$$

with correlation coefficient r of 0.9972.

TABLE 1

| | Example 1 | Example 2 | Comparative Example 1 | Comparative Example 2 | Comparative Example 3 | Comparative Example 4 | Comparative Example 5 |
|---|---|---|---|---|---|---|---|
| Concentration X of chlorine atoms contained in atmosphere after the second cleaning (ng · m$^{-3}$) | 120 | 750 | 1514 | 5387 | 2471 | 5700 | 6800 |
| Concentration Y of chlorine atoms on main surface of substrate (×10$^{10}$ cm$^{-2}$) | 167 | 668 | 1302 | 2299 | 2413 | 4421 | 4895 |
| PL intensity Z of AlGaInP epitaxial layer (AU) | 70 | 64 | 60 | 53 | 51 | 38 | 32 |

Figure 6:
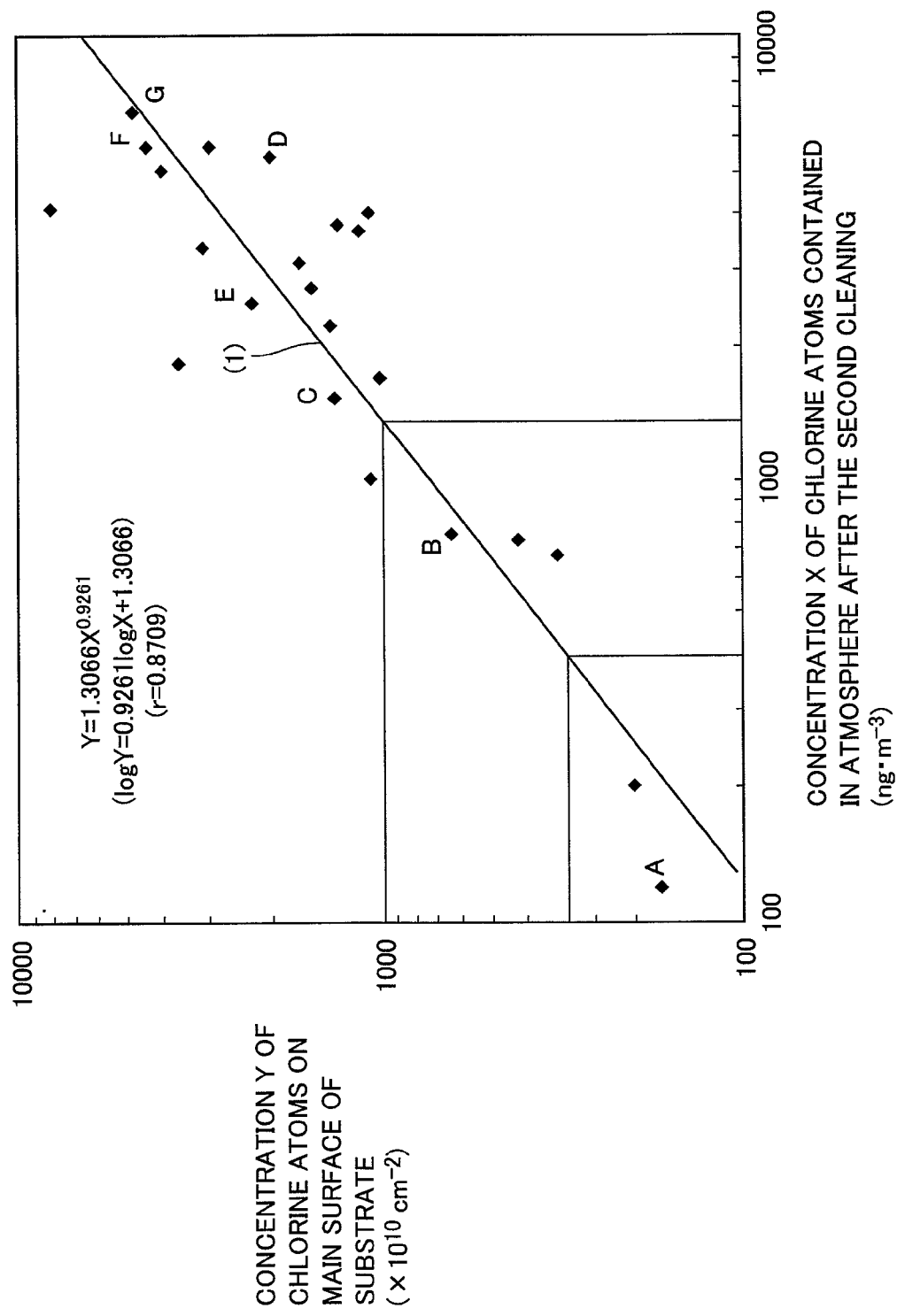
FIG. 6 is a graph showing the relationship between a concentration of chlorine atoms contained in an atmosphere around a substrate after the second cleaning and a concentration of chlorine atoms on a main surface of the substrate.

The relationship between concentrations X of chlorine atoms contained in atmospheres around substrates after the second cleaning (as to examples 1 and 2, concentrations of chlorine atoms contained in the clean chamber) (unit: ng·m$^{-3}$) and concentrations Y of chlorine atoms on main surfaces of the substrates (unit: ×10$^{10}$ cm$^{-2}$) in examples 1 and 2 and comparative examples 1 to 5 is plotted as points A to G, respectively, in a graph of FIG. 6. Further, the relationship described above in other examples and comparative examples is also plotted in the graph of FIG. 6.

As can be seen from FIG. 6, it is recognized that there is a correlation between concentration X of chlorine atoms contained in an atmosphere around a substrate after the second cleaning (unit: ng·m$^{-3}$) and concentration Y of chlorine atoms on a main surface of the substrate (unit: ×10$^{10}$ cm$^{-2}$), represented by the following equation (1):

$$Y = 1.3066 X^{0.9261} \tag{1}$$

with a correlation coefficient r of 0.8709. It is to be noted that, in FIG. 6 with a double logarithmic scale, equation (1) is represented as log Y=0.9261 log X+1.3066.

It is found from equation (2) that an AlGaInP epitaxial layer having a high PL intensity of not less than 62 AU is formed on a main surface of a GaAs semiconductor substrate in which concentration Y of chlorine atoms on the main surface is not more than 1×10$^{13}$ cm$^{-2}$, and an AlGaInP epitaxial layer having a higher PL intensity of not less than 69 AU is formed on a main surface of a GaAs semiconductor substrate in which concentration Y of chlorine atoms on the main surface is not more than 3×10$^{12}$ cm$^{-2}$. Herein, a semiconductor device having an AlGaInP epitaxial layer with a higher PL intensity emits light more intensely and has a reduced threshold, exhibiting higher performance.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A GaAs semiconductor substrate including a main surface having an inclined angle of 6° to 16° with respect to a (100) plane, wherein a concentration of chlorine atoms on said main surface is not more than $1.67\times10^{12}$ cm$^{-2}$.

2. A group III-V compound semiconductor device comprising:

a GaAs semiconductor substrate including a main surface having an inclined angle of 6° to 16° with respect to a (100) plane, a concentration of chlorine atoms on said main surface being not more than $1.67\times10^{12}$ cm$^{-2}$; and at least one group III-V compound semiconductor layer containing not less than three elements formed on said main surface of said GaAs semiconductor substrate.

\* \* \* \* \*